United States Patent [19]

Yasar et al.

[11] Patent Number: 5,958,134
[45] Date of Patent: Sep. 28, 1999

[54] PROCESS EQUIPMENT WITH SIMULTANEOUS OR SEQUENTIAL DEPOSITION AND ETCHING CAPABILITIES

[75] Inventors: Tugrul Yasar, Woodstock; Ira Reiss, New City; Subhadra Gupta, Valley Cottage; Rajendrapura Seetharamaiya Krishnaswamy, Spring Valley; Israel Wagner, Monsey, all of N.Y.

[73] Assignee: Tokyo Electron Limited, Tokyo, Japan

[21] Appl. No.: 08/566,504

[22] Filed: Dec. 4, 1995

Related U.S. Application Data

[63] Continuation of application No. 08/488,064, Jun. 7, 1995, abandoned.

[51] Int. Cl.$^6$ .......................... C23C 16/00; C23C 14/00; C23F 1/02
[52] U.S. Cl. .............. 118/50; 118/719; 118/729; 204/298.23; 204/298.25; 204/298.26; 204/192.1; 204/192.35; 156/345
[58] Field of Search ............... 118/50, 719, 729; 204/298.23, 298.25, 298.26, 192.1, 192.35; 156/345

[56] References Cited

U.S. PATENT DOCUMENTS

| | | | |
|---|---|---|---|
| 3,562,140 | 2/1971 | Skinner et al. | 118/319 |
| 3,968,018 | 7/1976 | Lane et al. | 204/192 |
| 4,626,336 | 12/1986 | Bloomquist et al. | 204/298 |
| 4,663,009 | 5/1987 | Bloomquist et al. | 204/192.2 |
| 4,722,298 | 2/1988 | Rubin et al. | 118/715 |
| 4,749,465 | 6/1988 | Flint et al. | 204/298 |
| 4,882,028 | 11/1989 | Chhabra | 204/298 |
| 5,032,243 | 7/1991 | Bache et al. | 204/192.34 |
| 5,048,191 | 9/1991 | Hahn | 30/346.54 |
| 5,056,227 | 10/1991 | Kramer | 30/346.54 |
| 5,088,202 | 2/1992 | Boland et al. | 30/346.54 |
| 5,110,249 | 5/1992 | Norman | 414/217 |
| 5,121,660 | 6/1992 | Kramer | 76/104.1 |
| 5,129,289 | 7/1992 | Boland et al. | 76/104.1 |
| 5,142,785 | 9/1992 | Grewal et al. | 30/32 |
| 5,232,568 | 8/1993 | Parent et al. | 204/192.3 |
| 5,377,816 | 1/1995 | Deligi et al. | 198/619 |

FOREIGN PATENT DOCUMENTS

| | | |
|---|---|---|
| 0287118 | 10/1988 | European Pat. Off. . |
| WO94/00868 | 1/1994 | WIPO . |
| WO9400868 | 1/1994 | WIPO . |

OTHER PUBLICATIONS

PCT Search Report, filed May 6, 1996, PCT/US96/08981.

*Primary Examiner*—James C. Housel
*Assistant Examiner*—V. Ryan
*Attorney, Agent, or Firm*—Wood, Herron & Evans, L.L.P.

[57] ABSTRACT

Method and apparatus for forming the longitudinal edges of stacks of razor blades by conveying the stacks of razor blades along a conveying path in a vacuum chamber past material deposition and material etching stations. The material etching stations are mounted in the sides of the vacuum chamber to be directed generally toward the edge sides of the edges of the razor blades. In another embodiment, stacks of razor blades are mounted on opposite sides of a rotating pallet and material deposition and etching stations are mounted in both side walls of the vacuum chamber. A DC or RF bias is applied to the stacks of razor blades by capacitively coupling the RF bias or conducting by electrical contacts a DC or RF bias to a central portion of the rotating pallet.

21 Claims, 5 Drawing Sheets

FIG. I

PROCESS EQUIPMENT WITH SIMULTANEOUS OR SEQUENTIAL DEPOSITION AND ETCHING CAPABILITIES

This is a continuation of application Ser. No. 08/488,064 filed on Jun. 7, 1995.

FIELD OF THE INVENTION

The invention relates generally to methods and apparatus for depositing and etching materials, and more particularly, the invention provides improved methods and apparatus for depositing and etching materials to form cutting edges on razor blades.

BACKGROUND OF THE INVENTION

The use of material deposition processes to coat the edges of razor blades with different materials is known as disclosed in U.S. Pat. Nos. 5,142,785 and 5,232,568. As disclosed in those patents, a vacuum chamber has a carousel with a vertical axis of rotation that is parallel to a vertical work holding surface. A stack of razor blades is mounted on the work holding surface such that the longitudinal edges of the razor blades are generally parallel to the direction of motion of the work holding surface. The razor blades are moved to a first fixed position in which the blade edges are directly in front of and generally parallel to a first sputter target. Power is applied to the sputter target to deposit a thin molybdenum layer on the edges and the sides of the blade edges. The blades are then rotated approximately 90° and stopped at a second position directly in front of a second target which is generally parallel to the blade edges. Power is applied to the second target, and a second layer of material is deposited on the razor blade edges, and the sides forming the edges. The second layer of material may be another molybdenum layer, a layer of diamond-like carbon, or another desired material. While the above patents disclose processes for providing different layers or coatings of desired durable materials on the edges, they have the disadvantage of not being able to shape the edges to a desired contour.

U.S. Pat. No. 5,032,243 discloses a method and apparatus for providing both a material deposition process and a material etching process to form and contour the sides of edges of the razor blades. A rotating workholder in a vacuum chamber has a centrally located axis of rotation extending in a direction perpendicular to a work holding surface. A stack of razor blades is symmetrically located on the work holding surface with respect to the axis of rotation so that their longitudinal edges rotate in a plane perpendicular to the axis of rotation. Two material etching sources are located on either side of and generally in front of the longitudinal edges and are mounted to rotate about an axis of rotation perpendicular to the axis of rotation of the workholder. The material etching sources have a constant radius with respect to the midpoint of a centrally located edge within the stack. Consequently, each of the ion beam etching sources is directed at an adjustable angle with respect to the vertical plane; and hence, the sides of the edges. The angle may be varied to change the shape or contour of the layer of material being deposited and/or etched on the sides of the edges, thereby changing the edges themselves. An evaporation device may be located between the two ion beam etching sources and directly in front of the stack of razor blades. The electron beam evaporation device and the two ion beam etching sources are operated to obtain a balance between a deposition and subsequent sputter removal to form a layer of a desired material having the desired physical properties.

While the above apparatus operates satisfactorily to provide the desired material coatings on the edges, it has several inherent disadvantages. First, the requirement of moving the ion beam guns is cumbersome and requires very complex and expensive control mechanisms. Second, the entirety of the ion guns must be mounted within the vacuum chamber in order to facilitate their movement. Therefore, a larger, more complex and expensive vacuum chamber must be specially designed to accommodate the moving ion beam guns. Third, the stack of razor blades is centrally located with respect to the workholder axis of rotation and the arcuately moving ion beam guns; and therefore, only a single stack of razor blades can be processed at a time. Fourth, as the number of razor blades to be processed increases and the size of the stack of razor blades grows larger, there is a physical limit on the number of razor blades and size of the stack that may be properly processed by the arcuately moving ion guns. Therefore, to process a greater number of razor blades requires that additional vacuum chambers, ion guns and evaporation devices be provided.

SUMMARY OF THE INVENTION

An object of the invention is to provide a more efficient process and equipment for depositing and etching a layer of a desired material having predetermined physical characteristics on edges and edge sides of a large number of razor blades.

According to the embodiments of the present invention and in accordance with the principles thereof, the apparatus includes a vacuum chamber having a conveying device mounted therein. The conveying device has a work mounting surface and a location on the work mounting surface for receiving a stack of razor blades with the longitudinal edge of at least one of the razor blades in the stack of razor blades being substantially perpendicular to the conveying path. A plurality of material deposition processing stations are mounted at different fixed locations adjacent the conveying path and are operated to deposit and etch material on the longitudinal edges and the sides of the longitudinal edges to provide a material layer having predetermined physical characteristics.

In one aspect of the invention, the vacuum chamber includes a side wall generally parallel to the work mounting surface and further includes a material deposition station mounted at a fixed location in the side wall generally opposite the work mounting surface. First and second material etching stations are mounted at respective second and third fixed locations being displaced with respect to each other and the first fixed location with respect to the conveying path. The first and second material etching stations are also generally opposite the work mounting surface.

In another aspect of the invention, the first material etching station has a target generally parallel to first sides of the longitudinal edges of the razor blades as the razor blades move along the conveying path past the first etching station. Further, the second etching station has a target generally parallel to second sides of the longitudinal edges of the razor blades as the razor blades pass along the conveying path past the second material etching station.

In a further aspect of the invention, the conveying device is a pallet rotatably mounted within the vacuum chamber for moving the stack of razor blades in a circular conveying path. The pallet has an axis of rotation generally perpendicular to the work mounting surface and a location on the work mounting surface a predetermined radius from the axis of rotation for receiving the stack of razor blades. The longitudinal edge of at least one of razor blades in the stack of razor blades being substantially parallel to the predetermined radius as the pallet moves the stack of razor blades in the circular path.

In another embodiment, the invention provides a method of shaping substantially parallel longitudinal edges of razor blades in a stack of razor blades using a material deposition and etching process. The method comprising the steps of providing in a vacuum chamber, a conveying device having a predetermined path and mounting the stack of razor blades on the conveying device with the longitudinal edge of at least one of the razor blades substantially perpendicular to the path of the conveying device. Further, conveying the stack of razor blades along the path past a plurality of material deposition and etching stations and operating the material deposition and etching stations to shape the longitudinal edges of the stack of razor blades.

In a still further embodiment, the vacuum chamber includes apparatus for applying a direct current ("DC") or radio frequency ("RF") bias to a stationary or movable pallet so that the two major, opposed surfaces of the pallet are available for holding substrates or other workpieces.

These and other objects of the invention will become more apparent in the following detailed description in association with the attached drawings.

DETAILED DESCRIPTION OF THE INVENTION

Figure 1:
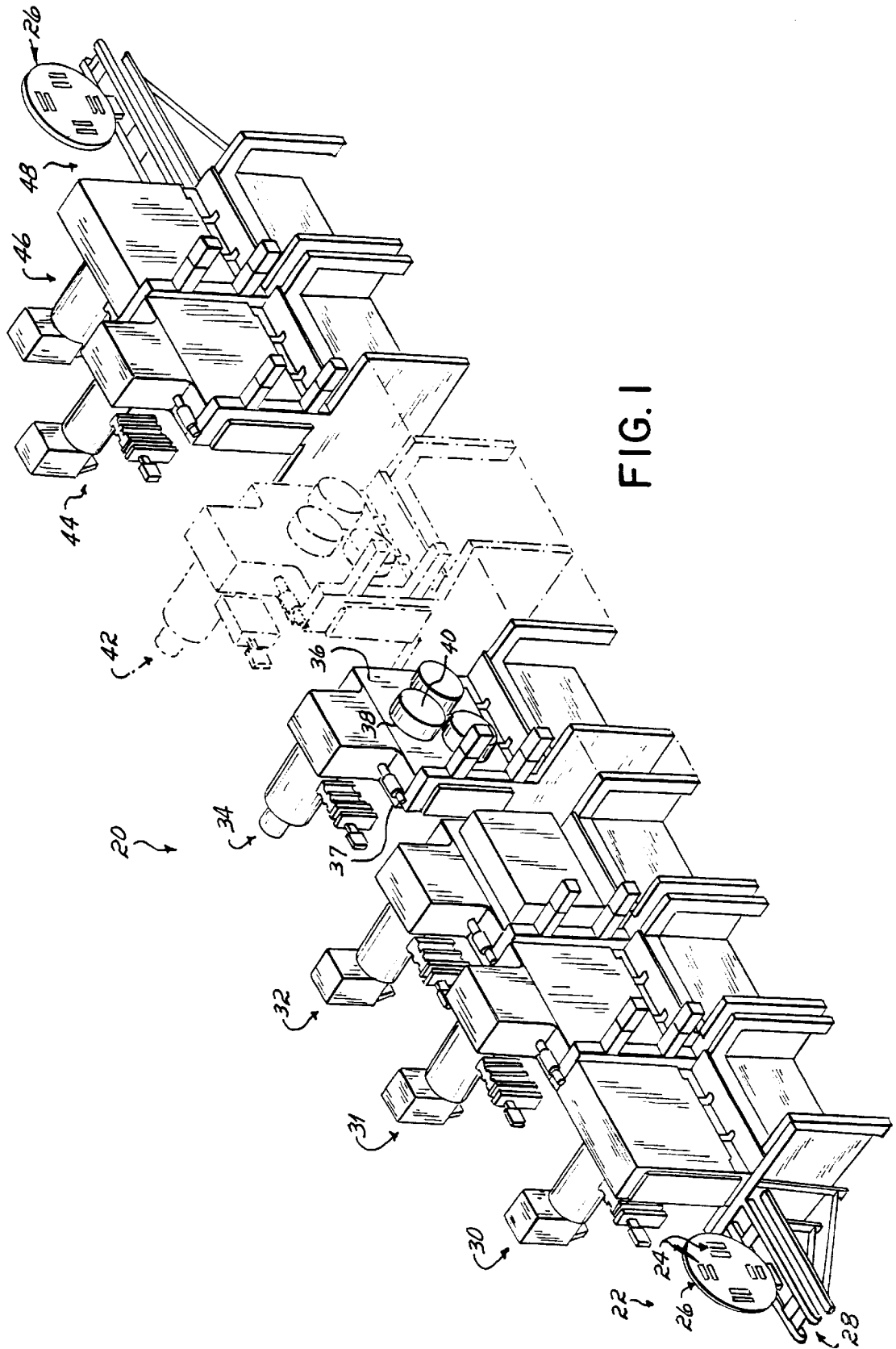
FIG. 1 is a schematic diagram of a processing line including processing stations for forming edges in accordance with the principles of the present invention.

FIG. 1 illustrates process equipment in a production line 20 that includes a number of processing stations that preferably are used for the simultaneous, or sequential, deposition and removal of material from a work piece. At a loading station 22, articles 24 to be processed are located on a pallet 26 which is mounted on a conveyor 28 that moves the pallet 26 through the processing line 20 either under manual or automatic control. After the articles to be processed are loaded on the pallet 26, the pallet is moved into an entry load lock 30 which operates as an entry buffer or queue for the processing line 20. The pallet 26 is then transferred to an entry high vacuum station 31 which pulls a vacuum equal to the vacuums that are in the other vacuum chambers on the production line 20. The pallet is then transported by the conveyor 28 to a second one or more processing vacuum chambers 32. The conveyor 28 may move the pallet 26 by approximate mechanisms, for example, by magnetic forces created by magnets moving along the desired path of the conveyor 28. Depending on the article being processed, the one or more vacuum chambers 32 may include an etching station which is effective to clean the articles 24 prior to subsequent processing. In addition, after the etching station, the processing stations 32 may include one or more deposition stations to apply one or more coatings of materials onto the articles 24.

Thereafter, the conveyor 28 transports the pallet 26 to another processing station 34 that deposits a coating on the articles 24 by the sputtering and removal of materials in accordance with the principles of the present invention. Simultaneous or sequential sputtering and removal of materials from the articles 24 provides a coating thereon that has certain special physical, morphological, electrical, magnetic, thermal or other physical characteristics. Further, the properties of the coating such as hardness, tribological characteristics, conformal properties, optical, magnetic and electrical properties can be modified and optimized by simultaneous sputter, evaporation or electron beam deposition and partial removal of deposited materials while deposition continues. If the removal rate of material from the article is less than the arrival rate of material to the article, the net deposition rate is positive; and material is accumulated on the article. Similarly, if the rate of removal of material from the article is greater than the arrival rate of material to the article, then the net deposition rate is negative; and material is removed from the article. Therefore, the simultaneous or sequential material deposition and material removal (etching) processes in the vacuum chamber 34 are used to shape or reshape coatings deposited on the articles, as well as to achieve certain physical characteristics of the coatings. Deposition can be by evaporation, e-beam, and sputtering. Sputter deposition can be achieved by DC diode, DC magnatron, RF diode, RF magnatron or by other methods such as RF plus DC diode or magnatron. The etching or removal of material from the article can be achieved by DC sputter etching with or without magnetic field assist, RF sputter etching with or without magnetic field assist, ion beam etching, reactive ion etching, inductively coupled plasma etching or ECR plasma etching, etc.

The vacuum chamber 34, as with the other processing chambers on the production line 20, is isolated from adjacent chambers to eliminate contamination and process interference between the chambers. The chamber 34 as with the other chambers on the production line 20, has two active side walls 36, 37, and each side wall has a plurality of openings 38 which may be covered or into which processing elements 40 may be mounted. For example, if there are two openings on one side of the module, a cathode can be mounted into each opening to sputter deposit one or two materials sequentially or simultaneously onto articles 24 on the pallet 26. Alternatively, one of the openings can be used to mount an etching station such as an ion gun, and a deposition source such as a sputtering cathode can be mounted in the other opening. This configuration allows the deposition of a material and its removal in the same chamber. By adjusting the deposition rate with respect to the removal rate, different properties of coatings on the articles can be achieved. Since the large chamber wall 36 can accommodate many openings, many different processing elements or tools can be used, for sputtering cathodes, ion beam guns, inductively coupled or ECR etch modules, heaters, electron guns, etc., can be positioned into these openings to permit simultaneous or sequential treatment of the articles 24 on the pallet 26.

After the material processing in vacuum chamber 34 is completed, the conveyor 28 moves the pallet 26 to the next processing station 42 shown in phantom in FIG. 1. The processing station 42 may be a vacuum chamber identical to the chamber 34, or any other processing chamber, for example, one to deposit another material on the articles 24. Thereafter, the pallet 26 is moved by the conveyor 28 to an exit high vacuum lock 44 which isolates itself from the processing chambers 42, and releases the processing vacuum. The pallet 26 is then transported by the conveyor 28 to the exit load lock 46 which is an exit buffer or queue and is maintained at atmospheric pressure. The conveyor 28 also transports the pallet 26 to the exit station 48. At the exit station, the pallet may be manually or automatically removed from the processing line 20 or transported to a subsequent processing line.

Of particular interest in the present invention is the use of material deposition and material etching techniques to form and shape a cutting edge. Ultrasharp cutting edges such as those found on razor blades are often a complex profile or cross section formed by the deposition of layers of different materials in different planes on cutting edge sides that converge to a cutting edge tip. Further, there is a continuing search to optimize and improve the efficiency of the processes required to form the various coatings to the desired geometric shapes in the planes or facets of the cutting edge. In addition, the desired cutting edge, as defined by the materials and geometries forming the edge, may change as a function of the specific markets in which the cutting edge is to be used. Therefore, it is highly desirable to have processing equipment that produces a high volume of high quality cutting edges in a shorter period of time.

Figure 2:
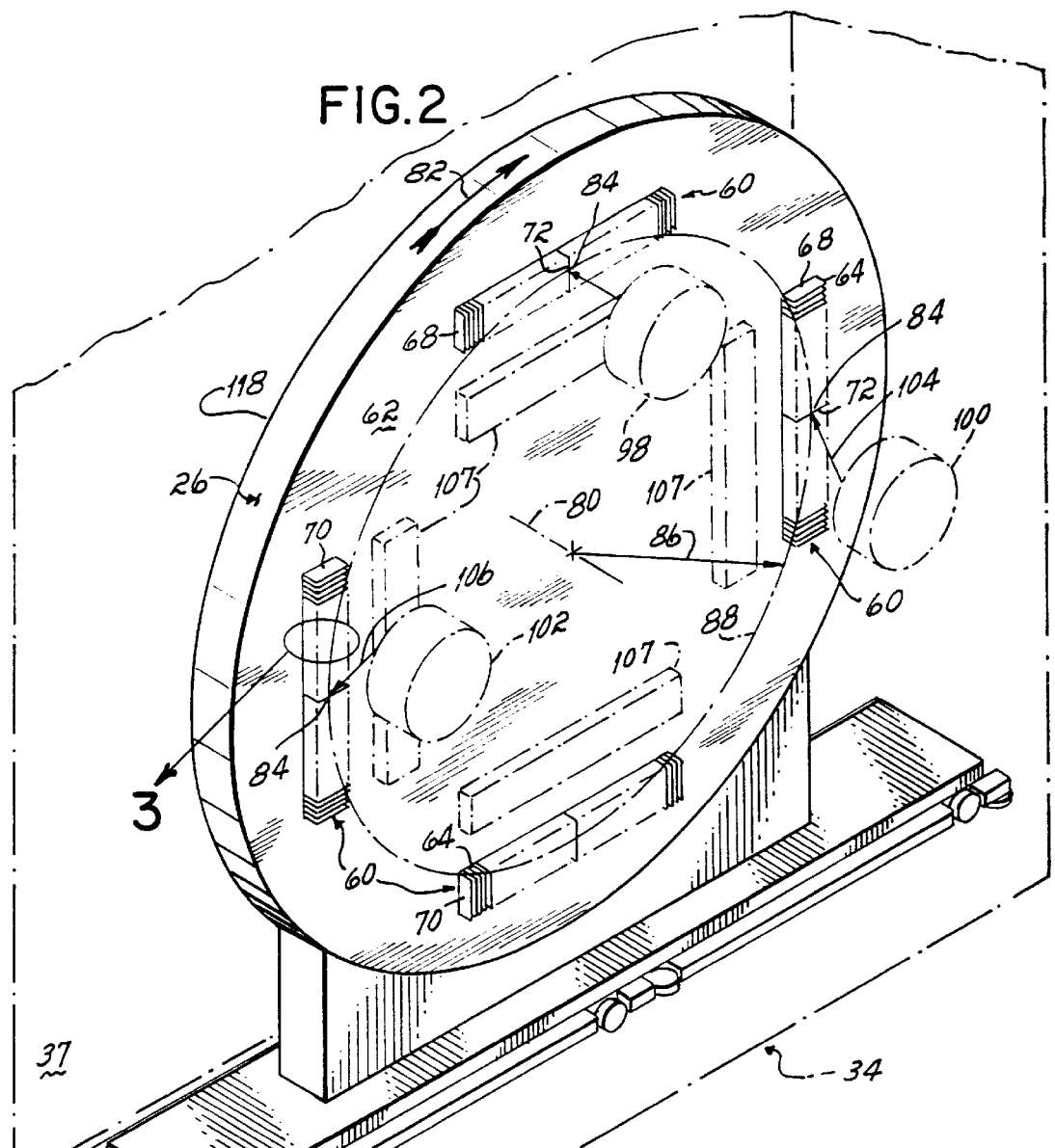
FIG. 2 is a schematic diagram of the interior of a processing chamber for forming edges in accordance with the principles of the present invention.
Figure 3:
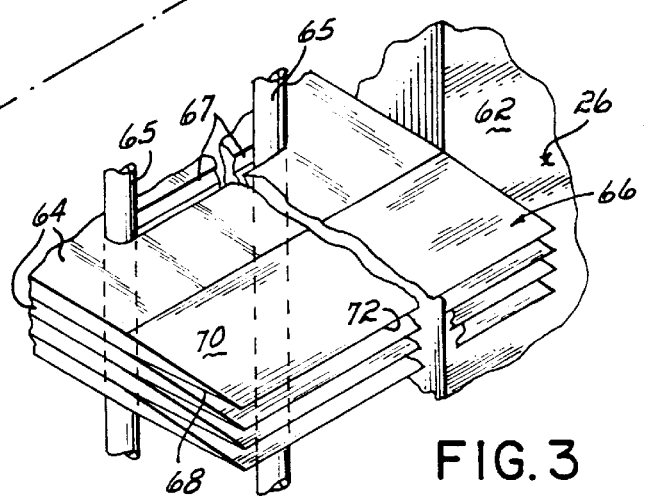
FIG. 3 is an enlarged schematic view of the encircled area of FIG. 2.

After being mechanically finished and superfinished, such as by grinding, honing, lapping, etc., the razor blades are cut to length and mounted in a stack such that the longitudinal edges of the blades are parallel. Referring to FIGS. 2 and 3, such stacks of razor blades 60 are illustrated mounted to a mounting surface 62 of the pallet 26. Typically, each of the stacks of razor blades 60 is formed by mounting each of the razor blades 64 on one or more wire or rod spindles 65 that extend through holes 67 in each of the razor blades 64. The razor blades 64 are arranged in the stacks 60 so that their longitudinal edges 66 are parallel to each other. Each of the longitudinal edges 66 on the blades 64 is formed by first and second edge sides 68 and 70 which converge at a longitudinal edge tip 72.

The pallet 26 rotates about a centrally located axis of rotation 80. The direction of the rotation may be clockwise or counter-clockwise but for purposes of this description, the pallet 26 in FIG. 2 will be described as rotating in the clockwise direction as shown at 82. Therefore, every point on the pallet 28 which is displaced from the axis of rotation 80 has a closed or circular path of motion with respect to the axis of rotation 80. The pallet rotation may be driven by any of several known mechanisms. For example, the pallet can be rotated by magnetic forces created by a rotating magnet centrally located on an outside surface of the side wall of the vacuum chamber. Such a magnetic drive is disclosed in PCT Publication No. WO 94/00868, entitled TRANSPORT SYSTEM FOR WAFER PROCESSING LINE, published on Jan. 6, 1994, which is assigned to the assignee of the present invention; and the disclosure of which is hereby incorporated by reference.

In order to increase the capability of the processing chamber 34, the rotating pallet 26 has a plurality of stacks of razor blades 60 located on the work mounting surface 62. Preferably, the stacks of razor blades 60 are mounted at a plurality of locations on the work mounting surface 62 so that the center 84 of each of the stacks 60 is displaced from the axis of rotation 80 by a predetermined radius 86. Therefore, the rotating pallet 26 moves the stacks 60 through a circular conveying path 88, and preferably, the center 84 of each of the stacks of razor blades 60 are on the path 84. Further, the stacks of razor blades 60 are preferably oriented on the surface 62 so that one of the longitudinal edge tips 72 in each of the stacks 60 is parallel with the radius 86. Therefore, those same longitudinal edge tips 72 are also perpendicular to the conveying path 88.

In one embodiment of the invention, the processing chamber 34 has a first side 36 in which is mounted a plurality of material deposition processing stations, shown in phantom in FIG. 2, for example, a sputtering cathode 98 operating as a deposition station, a first ion gun 100 operating as a first material etching station, and a second ion gun 102 operating as a second material etching station. The sputtering cathode 98 has a target (not shown) on the forward end thereof which is located generally opposite the cutting edge tips 72 of the longitudinal edges 66 of the stacks of razor blades 60. The ion gun 100 is oriented such that its ion beam 104 is directed toward the first edge sides 68 of the longitudinal edges 66. The ion gun 102 is oriented such that its ion beam 106 is directed toward the second edge sides 70 of the longitudinal edges 66.

In use, after the pallet 26 is moved by the conveyor 28 into the processing chamber 34, the desired vacuum is drawn on the chamber 34; and the rotation of the pallet 26 is initiated. As each of the stacks of razor blades 60 moves in front of the material deposition station, that is, the sputtering cathode 98, a coating of the material is deposited on the edge sides 68, 70 and edge tips 72 of the longitudinal edges 66. As the pallet 26 continues to rotate in the clockwise direction 82, the edge sides 68 enter the path of the first ion beam 104 of the first ion gun 100. The ion gun 100 is adjusted to perform a sputtering process in which the rate of material removed exceeds the rate of material arriving at the edge sides 68. Therefore, the ion gun 100 operates as a first etching station to remove material and shape the coating on the first edge sides 68 and a portion of the longitudinal edge tip 72 to produce the desired geometry and other physical characteristics. Continued rotation of the pallet 26 brings the edge sides 70 into the path 106 of the second ion gun 102. In a similar manner, the operation of the ion gun 102 is adjusted to provide a sputtering process in which there is a net removal of material from the second edge sides 70 and edge tip 72. Therefore, the ion gun 102 functions as a second material etching station which is effective to form the edge sides 70 and associated portion of the longitudinal edge tip 72 to have the desired geometry and other physical characteristics. The above described process continues as the pallet 26 rotates the stacks of razor blades 60 in multiple revolutions, thereby successively that is sequentially depositing and etching a coating of a desired material from the first edge side 68 and then the second edge side 70 and longitudinal edge tips 72 so that it has the desired geometry and other physical characteristics which may vary as the coating extends over the edge sides 68, 70 to the longitudinal edge tips 72. The pallet 26 is then conveyed to other processing chambers 42 which may include a chamber similar to the processing chamber 34 in which additional coatings of the same or different materials may be applied to the stacks of razor blades 60 on the pallet 26.

Figure 4:
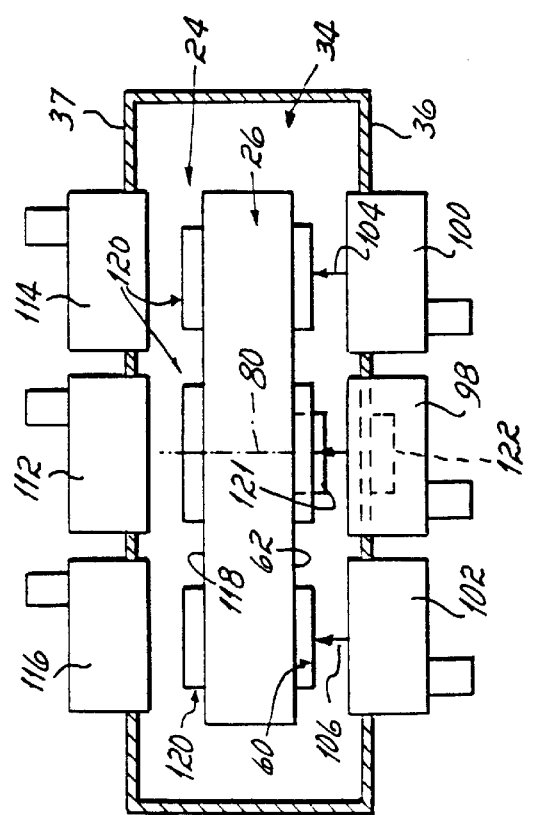
FIG. 4 is a schematic diagram of alternative embodiment of the processing chamber of FIG. 2.

In order to further increase, for example, double, the processing capability of the processing chamber 34, the rotating pallet 26 may have additional stacks of razor blades 107 (shown in phantom) which are aligned with and generally parallel to the stacks of razor blades 60. FIG. 4 illustrates a further embodiment in which the vacuum chamber 34 has a second side wall 37 which includes a second set of material deposition processing stations that are identical to the devices mounted on the first side wall 36. For example, a second sputtering cathode 112 forms a second deposition station; and third and fourth ion guns 114, 116 operate as third and fourth material etching stations. Further, the rotating pallet 26 has a second work mounting surface 118 which is substantially identical to and located opposite from the first work mounting surface 62. The second work mounting surface 118 has stacks of razor blades 120 assembled and mounted thereon in a manner substantially identical to that described with respect to the stacks of razor blades 60 located and mounted on the first work mounting surface 62. Therefore, by utilizing a second opposite side 37 of the processing chamber 34 and a second opposite work mounting surface 118 of the rotating pallet 26, the capacity of the processing chamber can be doubled again.

In the process of coating and shaping the edges of razor blades or coating any other substrate, it may be desirable to apply a DC or RF bias to the workpieces 60, 120 on the pallet 26. In known devices, the RF bias is applied by a capacitive coupling or physical contact of an electrode with the pallet. In order to conduct the current necessary to achieve the desired RF or DC power, a large area of contact is required and is achieved by utilizing a circular disc, or plate, having an area approximately equal to the area of the surface of one of the sides 62, 118 of the pallet 26. With the arrangement shown in FIG. 4 in which substrates 60, 120 are mounted on both sides 62, 118 of the pallet 26, it is physically impossible to utilize a contact or electrode having an area equal to the area of one of the sides 62, 118. Further, centrally located on surface 62 of pallet 26 is a driven magnet 121, which is rotated by driving magnet 122 located on the outside of chamber wall 36. Therefore, the area in which to apply a DC or RF bias to the pallet is restricted.

Figure 5:
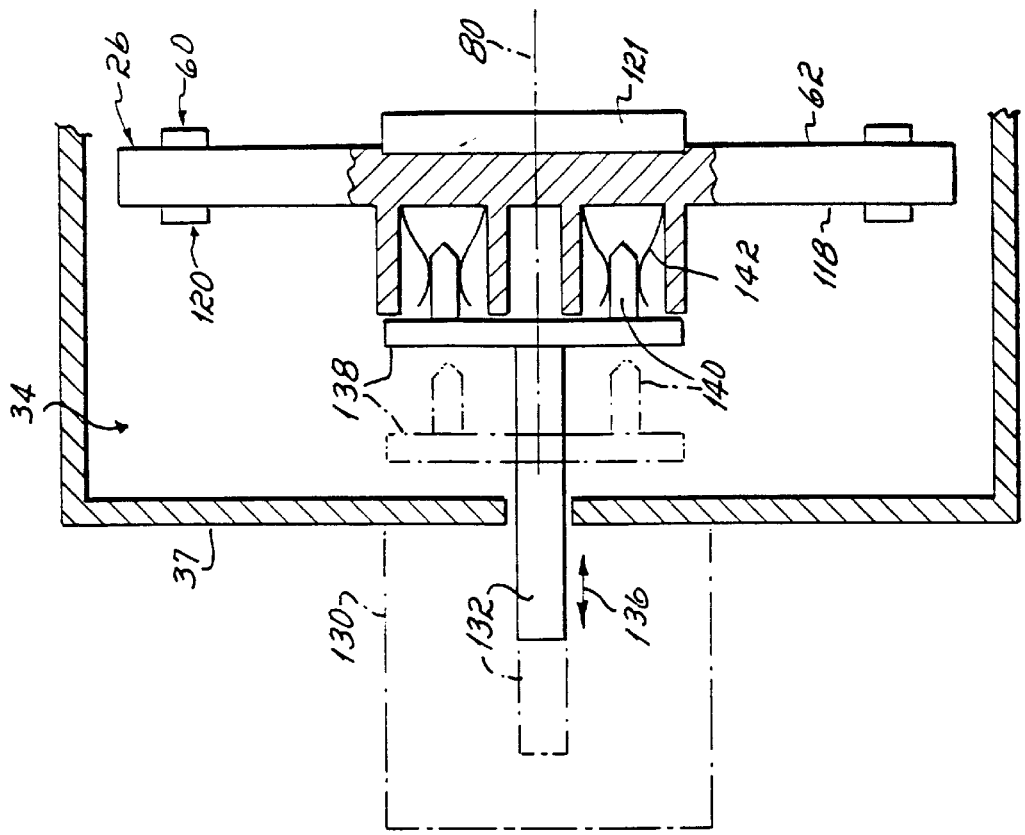
FIG. 5 is a side schematic view of a vacuum chamber illustrating apparatus for mechanically coupling a DC or RF bias to a rotating pallet.

FIG. 5 illustrates an embodiment for applying a DC or RF bias to a central portion of the pallet 26. A chamber side wall, for example wall 110, has a biasing element 130 extending centrally therethrough. The biasing element 130 includes a shaft 132 which is mounted to rotate with the rotation of the pallet 26. In addition, the shaft 132 is moved in a reciprocal motion as indicated at 136 by a mechanism, for example a cylinder (not shown). A plate 138 is mounted on the end of the shaft 132 within the processing chamber 34. Biasing contacts 140 are mounted on the plate 138. The contacts 140 are sized and shaped to fit in a contacting relationship with receptacles 142 which are mounted on the pallet 26 at a location opposite the contacts 140. Therefore, when a bias is to be applied, the shaft 132 is moved linearly toward the pallet 26 until the electrodes 140 engage the electrode sockets 142. A DC or RF bias is then applied to the shaft 132 to provide a similar bias to the stacks of razor blades 60, 120 which are located on both sides of the pallet 26. The applied bias facilitates the etching process being performed by the ion guns 100, 102, 114, 116.

Figure 7:
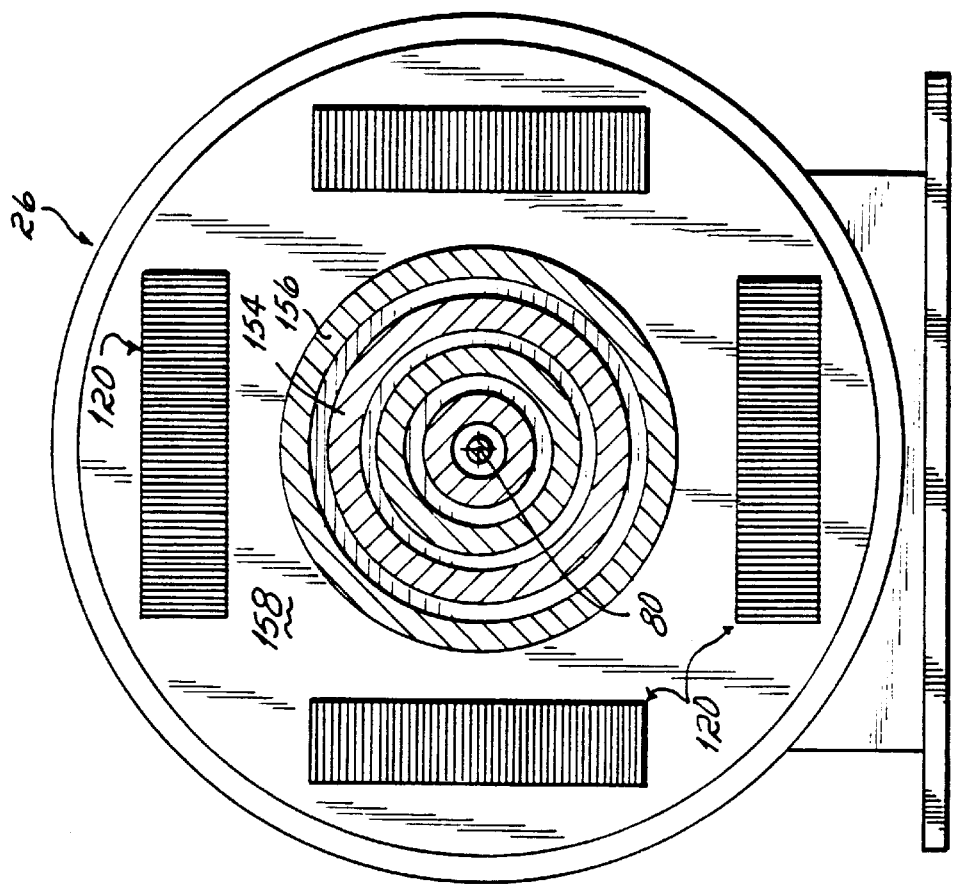
FIG. 7 is a cross-sectional view taken along line 7—7 of FIG. 6.
Figure 6:
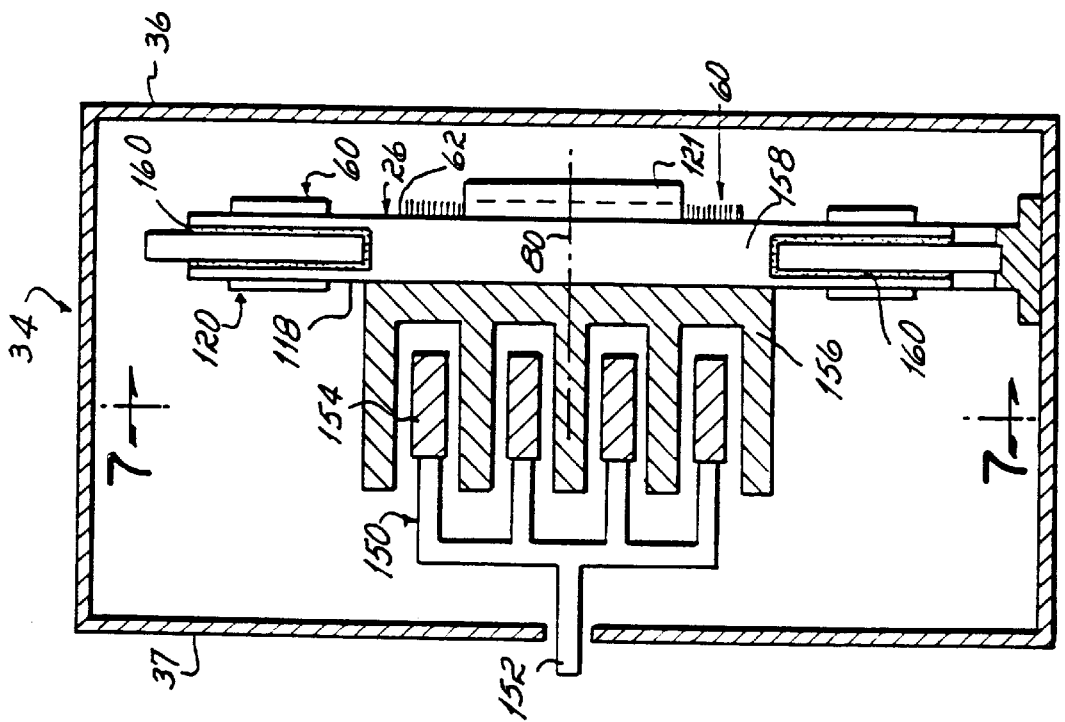
FIG. 6 is a side schematic view of a vacuum chamber illustrating apparatus for capacitively coupling RF to a rotating pallet.

Instead of applying the etching bias by direct contact as shown in FIG. 5, the etching bias may be provided by capacitive coupling as illustrated in FIGS. 6 and 7. A biasing element 150 has a shaft 152 cylindrical biasing plates 154 which are concentrically located with respect to the axis of rotation 80 of the pallet 26 and the shaft 152 extends through one of the sidewalls, for example, side wall 37 of the processing chamber 34. The biasing element 150 is selectively moved in a reciprocating motion to move the stationary cylindrical biasing plates 154 between rotating cylindrical plates 156 which are centrally located on the pallet 26. As the pallet 26 rotates about the axis of rotation 80, the rotating plates 156 are continuously capacitively coupled to the stationary plates 154, thereby providing the RF bias to the stacks of razor blades 60, 120.

FIG. 6 also illustrates an alternative embodiment which permits the RF bias to be concentrated with respect to a particular area of the pallet 26. Centrally located within the pallet 26 is a biasing plate 158 onto which the stacks of razor blades 60, 120 are mounted. The biasing plate 158 is electrically isolated, that is, insulated, from the pallet 26 and the rest of the vacuum chamber and hence from a ground potential by insulating material 160. The biasing plate is effective to concentrate the RF over a lesser area, thereby requiring less RF power than if the entire rotating pallet 26 were subject to the RF. In other situations, for example, the embodiment illustrated in FIG. 5 where RF is coupled by a physical contact to the pallet, the insulating material 160 permits the biasing element to have a different electrical potential than the pallet 26.

Figure 9:
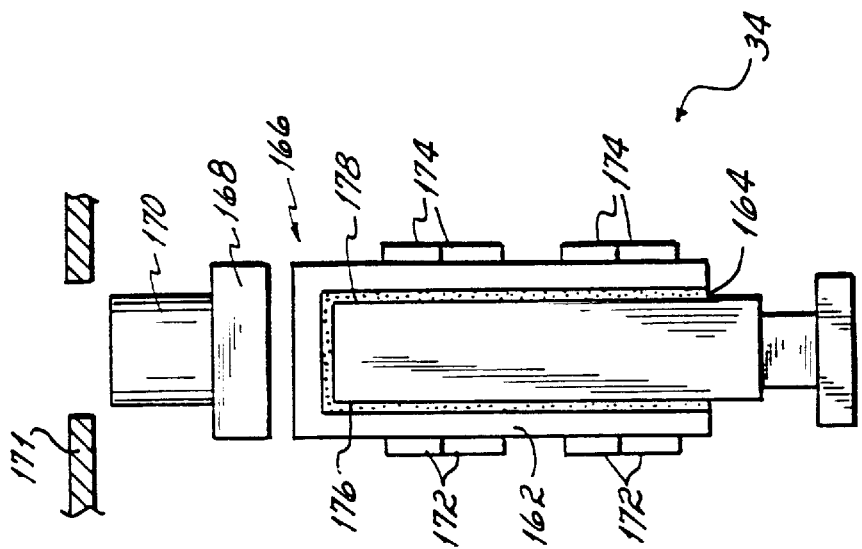
FIG. 9 is a cross-sectional view taken along line 9—9 of FIG. 8.
Figure 8:
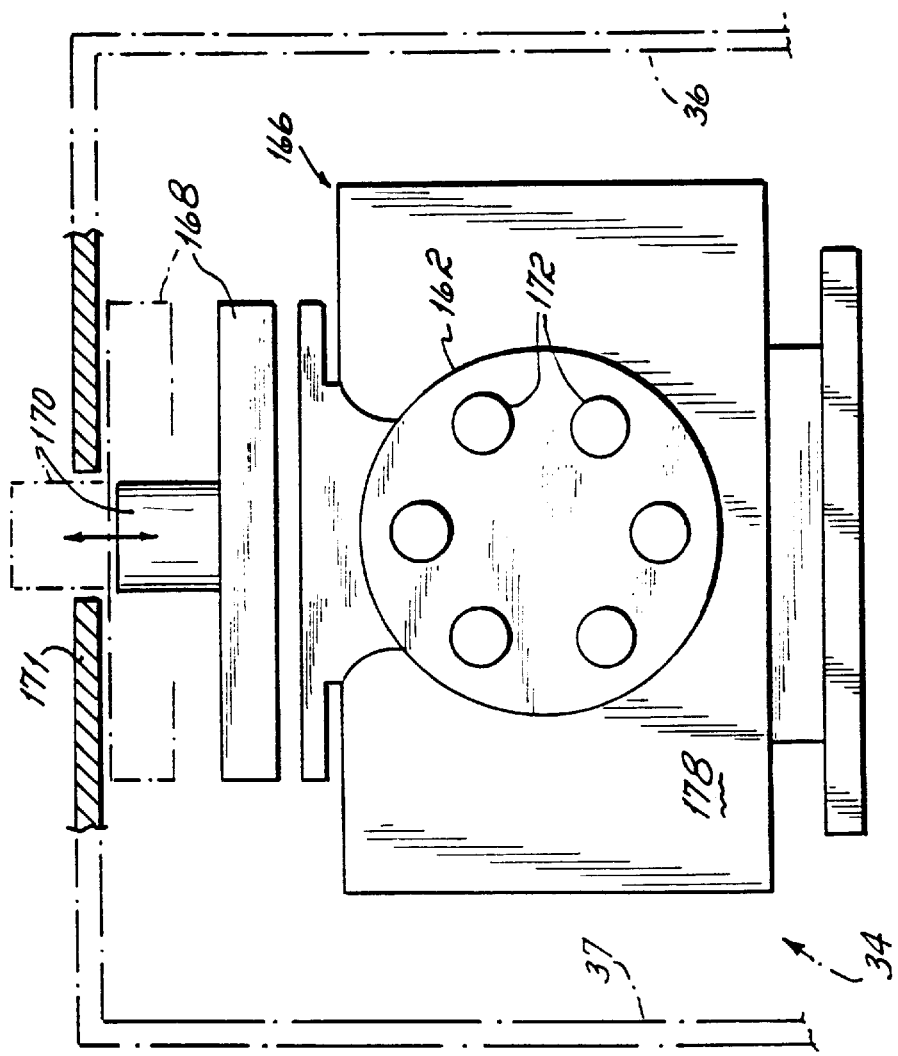
FIG. 8 is a side schematic view of a vacuum chamber illustrating apparatus for mechanically coupling a DC or RF bias to a stationary pallet.

A similar arrangement is illustrated in FIGS. 8 and 9 in which a biasing plate 162 is electrically isolated by insulating material 164 from a stationary pallet 166. A DC or RF bias is directly applied to the biasing plate 162 by a movable contact 168 having an actuating shaft 170 that extends through the top 171 wall of the vacuum chamber 34. Workpieces or substrates 172, 174 are mounted and processed on opposite sides 176, 178 of the stationary pallet 166. Therefore, FIGS. 5 through 9 illustrate embodiments of the invention that permit a DC or RF bias to be applied to selected portions or the whole areas of opposite sides of a stationary or rotary pallet on which substrates or other workpieces are mounted to the opposite sides of the pallet.

While the invention has been set forth by a description of the embodiment in considerable detail, it is not intended to restrict or in any way limit the claims to such detail. Additional advantages and modifications will readily appear to those skilled in the art. For example, the pallet 26 which is rotated in the processing chamber 34 may be rotated either continuously or intermittently past the material deposition and etching stations. Further, while the material at deposition station 98 is described as a single sputtering cathode, as will be appreciated two sputtering cathodes may be used to selectively deposit a coating of material on the different edge sides 68, 70 and longitudinal edge tip 72 by mounting the two sputtering cathodes at angles similar to the angular mountings of the ion guns 100, 102. Therefore, one sputtering cathode and one ion gun will be directed toward one of the edge sides 68 and a second sputtering cathode and second ion gun will be directed toward a second edge side 70. The invention, therefore, in its broadest aspects, is not limited to the specific details shown and described. Accordingly, departures may be made from such details without departing from the spirit and scope of the invention.

What is claimed is:

1. An apparatus for shaping substantially parallel longitudinal edges of blades in stacks of blades by a material deposition process, the longitudinal edges having first and second edge sides converging to a longitudinal edge tip, the apparatus comprising:

a vacuum chamber;

a conveying device mounted within the vacuum chamber and providing an arcuate conveying path, the conveying device having a first work mounting surface, and a plurality of locations on the first work mounting surface receiving a first plurality of stacks of blades with the longitudinal edge of one of the blades in each of the stacks of blades oriented substantially perpendicular to the conveying path, the conveying device moving the plurality of stacks of blades along the conveying path;

a first material etching station mounted in the vacuum chamber at a first location along the conveying path and directed toward only the first edge side of the longitudinal edge of blades passing the first material etching station; and a second material etching station mounted in the vacuum chamber at a second location along the conveying path and directed toward only the second edge side of the longitudinal edge of blades passing the second material etching station, the conveying device moving the plurality of stacks of blades along the conveying path past the first etching station to etch the first edge side and successively past the second etching station to sequentially etch the second edge side.

2. The apparatus of claim 1 wherein the conveying device comprises a pallet rotatably mounted within the vacuum chamber for moving the first plurality of stacks of blades in a circular conveying path, the pallet having an axis of rotation generally perpendicular to the first work mounting surface, and the first plurality stacks of blades being oriented on the first work mounting surface with the longitudinal edge of at least one of the blades being substantially parallel to the predetermined radius, whereby the pallet moves the stack of blades along the circular conveying path.

3. The apparatus of claim 1 wherein the vacuum chamber has a first side wall generally parallel to the first work mounting surface, and the first and second material etching stations are mounted at first and second angles, respectively, in the side wall of the vacuum chamber to be generally opposite the respective first and second edge sides of respective longitudinal edges as the stack of blades moves along the conveying path.

4. The apparatus of claim 2 wherein the vacuum chamber has a second side wall generally parallel to the first side wall and the pallet has a second work mounting surface generally parallel to the second side wall and the first work mounting surface.

5. The apparatus of claim 4 wherein the second work mounting surface receives a second plurality stacks of blades generally equally spaced with respect to each other and with respect to the axis of rotation.

6. The apparatus of claim 5 wherein the second side wall of the vacuum chamber further includes:

a second material deposition station mounted at a first fixed location in the second side wall and generally opposite edge tips of the second plurality of stacks of blades on the second work mounting surface;

a third material etching station mounted at a second fixed location in the second side wall of the vacuum chamber, the second fixed location in the second side wall being generally directed toward first side surfaces of longitudinal edges of the the second plurality of stacks of blades; and a fourth material etching station mounted at a third fixed location in the second side wall of the vacuum chamber, the fourth material etching station being displaced from the second material deposition station and the third material etching station, and being generally directed to second side surfaces of the longitudinal edges of the the second plurality of stacks of blades.

7. The apparatus of claim 6 wherein the predetermined radius defines a central area with respect to the axis of rotation and the apparatus further comprises:

a first electrical contact mounted within the central area on one of the first and second work mounting surfaces, the first electrical contact being electrically connected to the stacks of blades on the first and second work mounting surfaces receiving the substrates; and a second electrical contact extending through one of the first and the side walls of the vacuum chamber opposite the one of the first and second work mounting surfaces of the pallet, the second electrical contact being selectively engaged and disengaged with the first electrical contact to apply and remove, respectively, a bias to the stacks of blades on the first and the second work mounting surfaces.

8. The apparatus of claim 6 wherein the predetermined radius defines a central area with respect to the axis of rotation and the apparatus further comprises:

a first electrode mounted within the central area on one of the first and second work mounting surfaces of the pallet, the first electrode being electrically connected to stacks of blades on the first and the second work mounting surfaces; and a second electrode extending through one of the first and second side walls of the vacuum chamber opposite the one of the first and the second work mounting surfaces of the pallet, the second electrode being selectively moved adjacent to and away from the first electrode to capacitively couple and uncouple, respectively, a RF bias to the stacks of blades on the first and the second work mounting surfaces.

9. An apparatus for depositing material on substrates comprising:

a vacuum chamber having first and second generally parallel side walls;

a pallet rotatably mounted within the vacuum chamber and having an axis of rotation generally perpendicular to the first and second side walls, and first and second generally parallel surfaces generally perpendicular to the axis of rotation, portions of each of the first and the second surfaces having means for receiving at least one of the substrates at a predetermined radius from the axis of rotation, the predetermined radius defining a central area with respect to the axis of rotation;

first and second material deposition processing stations mounted in the first and the second side walls, respectively, of the vacuum chamber at locations generally opposite the substrates on the portions of the first and the second surfaces;

a first electrode mounted within the central area on one of the first and the second surfaces of the pallet, the first electrode having a cylindrical plate concentric with the axis of rotation of the pallet, the first electrode being electrically connected to the portions of the first and the second surfaces receiving the substrates;

a second electrode having a shaft extending through one of the first and the second side walls of the vacuum chamber opposite the one of the first and the second surfaces of the pallet, the second electrode having a cylindrical plate concentric with the axis of rotation of the pallet, the cylindrical plate of the second electrode being selectively movable adjacent to and away from the cylindrical plate of the first electrode to capacitively couple and uncouple, respectively, a RF bias to the substrates on the portions of the first and the second surfaces.

10. An apparatus for depositing material on substrates comprising:

a vacuum chamber having first and second generally parallel side walls;

a pallet mounted within the vacuum chamber and having first and second generally parallel surfaces oriented within the vacuum chamber to be generally parallel to the first and second side walls, respectively, portions of the first and the second surfaces having means for receiving at least one of the substrates at a predetermined distance from a center of the pallet, the predetermined distance defining a central area of the pallet;

first and second material deposition processing stations mounted in the first and the second side walls, respectively, of the vacuum chamber at locations generally opposite the substrates on the portions of the first and the second surfaces;

a first electrical contact mounted on the pallet and having a surface located above and generally perpendicular to the first and second surfaces, the surface of the first electrical contact being electrically connected to the portions of the first and the second surfaces receiving the substrates; and a second electrical contact having a shaft extending through an upper wall of the vacuum chamber and having a surface generally parallel to the surface of the first electrical contact, the surface of the second electrical contact being selectively engagable and disengagable with the surface of the first electrical contact to apply and remove, respectively, a bias to the substrates on the portions of the first and the second surfaces.

11. The apparatus of claim 1 further comprising a first material deposition station mounted along the conveying path in a side wall of the vacuum chamber and directed toward the longitudinal edge of the blades passing the first material deposition station, the first material deposition station depositing material on both the first and second edge sides of respective longitudinal edges as the conveying device moves the stacks of blades along the conveying path past the first material deposition station.

12. An apparatus for shaping substantially parallel longitudinal edges of blades in a stack of blades by a material deposition process, the longitudinal edges having first and second edge sides converging to a longitudinal edge tip, the apparatus comprising:

a vacuum chamber;

a conveying device mounted within the vacuum chamber and providing a circular conveying path with respect to an axis of rotation, the conveying device having a first work mounting surface, and the first work mounting surface receiving the stack of blades, the stack of blades having a center displaced from a center of the axis of rotation, the conveying device moving the stack of blades along the conveying path;

a first material etching station mounted in the vacuum chamber at a first location along the conveying path and directed toward only the first edge side of the longitudinal edge; and a second material etching station mounted in the vacuum chamber at a second location along the conveying path and directed toward only the second edge side of the longitudinal edge, the conveying device moves the stack of blades along the conveying path past the first etching station to etch the first edge side and successively past the second etching station to sequentially etch the second edge side.

13. The apparatus of claim 1 further comprising a first material deposition station mounted along the conveying path in a side wall of the vacuum chamber and directed toward the longitudinal edge, the first material deposition station depositing material on both the first and second edge sides of the longitudinal edge as the conveying device moves the stack of blades along the conveying path past the first material deposition station.

14. An apparatus for shaping substantially parallel longitudinal edges of blades in a stack of blades by a material deposition process, the longitudinal edges having first and second edge sides converging to a longitudinal edge tip, the apparatus comprising:

a vacuum chamber having a first side wall;

a conveying device mounted within the vacuum chamber and providing an conveying path, the conveying device having a first work mounting surface, and receiving the stack of blades, the conveying device moving the stack of blades along the conveying path;

a first material etching station mounted in the side wall of the vacuum chamber at a first location along the conveying path and directed toward only the first edge side of the longitudinal edge; and a second material etching station mounted in the side wall of the vacuum chamber at a second location along the conveying path and directed toward only the second edge side of the longitudinal edge, the conveying device moving the stack of blades along the conveying path in a plane substantially parallel to the side wall of the vacuum chamber and past the first etching station to etch the first edge side and successively past the second etching station to sequentially etch the second edge side.

15. A method for shaping substantially parallel longitudinal edges of blades in stacks of blades using a material deposition process, the longitudinal edges having respective first and second edge sides converging to respective longitudinal cutting tips, the method comprising:

mounting first stacks of blades on a conveying device providing a conveying path with at least one of the blades in each of the first stacks of blades having a longitudinal cutting tip perpendicular to the conveying path;

conveying the first stacks of blades along the conveying path past a first material etching station directed toward only the first edge sides of the longitudinal edges of the first stacks of blades;

etching the first edge sides of the longitudinal edges of the first stacks of blades with the first material etching station; and successively conveying the first stacks of blades along the conveying path past a second material etching station directed toward only the second edge sides of the longitudinal edges of the first stacks of blades; and sequentially etching the second edge sides of the longitudinal edges of the first stacks of blades with the second material etching station.

16. A method for shaping substantially parallel longitudinal edges of blades in stacks of blades using a material deposition process, the longitudinal edges having respective first and second edge sides converging to respective longitudinal cutting tips, the method comprising:

mounting first stacks of blades on one side of a rotating pallet a predetermined radius from an axis of rotation of the rotating pallet, at least one of the blades in each of the first stacks of blades having a longitudinal cutting tip parallel to the predetermined radius;

conveying the first stacks of blades on the rotating pallet past a first material etching station directed toward only the first edge sides of the longitudinal edges of the first stacks of blades;

etching the first edge sides of the longitudinal edges of the first stacks of blades with the first material etching station; and successively conveying the first stacks of blades on the rotating pallet past a second material etching station directed toward only the second edge sides of the longitudinal edges of the first stacks of blades; and sequentially etching the second edge sides of the longitudinal edges of the first stacks of blades with the second material etching station.

17. The method of claim 15 further comprising conveying the first stacks of blades on the rotating past a material deposition station and depositing a material on the longitudinal edges of the first stacks of blades.

18. The method of claim 16 further comprising the steps of:

mounting second stacks of blades on an opposite side of the rotating pallet a second predetermined radius from an axis of rotation of the rotating pallet, at least one of the blades in each of the second stacks of blades having a longitudinal cutting tip parallel to the second predetermined radius;

conveying the second stacks of blades past a fixed second material deposition station mounted in the vacuum chamber;

depositing a material on the longitudinal edges of the second stacks of blades;

conveying the second stacks of blades past a fixed third material etching station mounted in the vacuum chamber, the third material etching station being directed toward the first edge sides of the longitudinal edges of the second stacks of blades and etching the material from the first edge sides of the longitudinal edges of the second stacks of blades; and conveying the second stacks of razor blades past a fixed fourth material etching station mounted in the vacuum chamber, the fourth material etching station being directed toward the second edge sides of the longitudinal edges of the second stacks of blades and etching the material from the second edge sides of the longitudinal edges of the second stacks of blades.

19. The method of claim 18 wherein the predetermined radius defines a central area on the sides of the pallet and wherein the method further comprises: selectively applying a bias to the central area of one of the sides of the pallet.

20. The method of claim 19 wherein the method further comprises selectively engaging and disengaging an electrical contact extending through one of the side walls with the central area of one of the sides of the pallet opposite the one of the side walls of the vacuum chamber, thereby applying a DC bias to the substrates.

21. The method of claim 19 wherein the method further comprises selectively moving an electrode extending through one of the side walls of the vacuum chamber immediately adjacent to and away from the central area of one of the sides of the pallet opposite the one of the side walls thereby capacitively coupling a RF bias to the substrates.

\* \* \* \* \*

UNITED STATES PATENT AND TRADEMARK OFFICE
CERTIFICATE OF CORRECTION

PATENT NO. : 5,958,134
DATED : September 28, 1999
INVENTOR(S) : Yasar et al.

It is certified that error appears in the above-indentified patent and that said Letters Patent is hereby corrected as shown below:

In column 3, line 1, after "one of", insert --the--.
    In column 5, line 56, after "pallet" delete "28", and insert therefor --26--.

In the Claims
    In claim 5, line 49, after "plurality", insert --of--.
    In claim 6, line 2, delete the second occurrence of "the".
    In claim 14, line 24, after "providing", delete "an", and insert therefor --a--.
    In claim 14, line 26-27, delete "and receiving", and insert therefor --and the first work mounting surface receiving-- as amended on December 17, 1998 in application claim 26, line 9.
    In claim 17, line 27, after "rotating", insert --pallet--.

Signed and Sealed this

Twenty-ninth Day of May, 2001

*Attest:*

NICHOLAS P. GODICI

*Attesting Officer*      *Acting Director of the United States Patent and Trademark Office*